(12) United States Patent
Dinc et al.

(10) Patent No.: US 6,738,948 B2
(45) Date of Patent: May 18, 2004

(54) ITERATION TERMINATING USING QUALITY INDEX CRITERIA OF TURBO CODES

(75) Inventors: Abdulkadir Dinc, Jersey City, NJ (US); Eoin M. Buckley, Edison, NJ (US); Haim Teicher, Manalapan, NJ (US)

(73) Assignee: Motorola, Inc., Schaumburg, IL (US)

( * ) Notice: Subject to any disclaimer, the term of this patent is extended or adjusted under 35 U.S.C. 154(b) by 530 days.

(21) Appl. No.: 09/829,224

(22) Filed: Apr. 9, 2001

(65) Prior Publication Data

US 2002/0184596 A1 Dec. 5, 2002

(51) Int. Cl.$^7$ ............................................. H03M 13/03
(52) U.S. Cl. ....................................................... 714/794
(58) Field of Search .................... 714/786, 794, 714/795, 791; 375/341, 262

(56) References Cited

U.S. PATENT DOCUMENTS

| | | | | | |
|---|---|---|---|---|---|
| 5,761,248 A | * | 6/1998 | Hagenauer et al. | ......... | 375/340 |
| 2002/0010894 A1 | * | 1/2002 | Wolf et al. | ................. | 714/793 |

OTHER PUBLICATIONS

Moher et al., Cross–entropy and iterative decoding, Nov. 1998, IEEE, Trans. on Info. Theory, vol. 44, No. 7, p. 3097–3104.*

Hagenauer et al., "Iterative Decoding of Binary Block and Convolutional Codes", IEEE Trans. Inf. Theory, vol. 42, Mar. 1996, pp. 429–445.

Shao, R. et al., "Two Simple Stopping Criteria for Turbo Decoding", IEEE Trans. Comm., vol. 47, No. 8, Aug. 1999, pp. 1117–1120.

Viterbi, A., "An Intuitive Justification and a Simplified Implementation of the MAP Decoder for Convolution Codes", IEEE Journal on Select. Areas Commun., vol. 16, No. 2, Feb. 1998, pp. 260–264.

Bahl et al., "Optimal Decoding of Linear Codes for Minimizing Symbol Error Rate", IEEE Trans. Inform. Theory, vol. IT–20, Mar. 1974, pp. 284–287.

* cited by examiner

*Primary Examiner*—Albert Decady
*Assistant Examiner*—Shelly A Chase
(74) *Attorney, Agent, or Firm*—Brian M. Mancini

(57) ABSTRACT

A method of terminating iteration calculations in the decoding of a received convolutionally coded signal includes a first step of providing a turbo decoder with a first and second recursion processors connected in an iterative loop. Each processor has an associated extrinsic input and output. A next step includes cross-correlating the input and output of at least one of the processors to provide a cross-correlation value at each iteration. A next step includes terminating the iterations when the measure of the cross-correlation value index exceeds a predetermined threshold.

14 Claims, 4 Drawing Sheets

— PRIOR ART —

ITERATION TERMINATING USING QUALITY INDEX CRITERIA OF TURBO CODES

CROSS REFERENCE TO RELATED APPLICATIONS

This application is related to U.S. patent application Ser. No. 09/553,646 by inventors Xu et al. The related application is assigned to the assignee of the present application, and are hereby incorporated herein in their entirety by this reference thereto.

FIELD OF THE INVENTION

This invention relates generally to communication systems, and more particularly to a decoder for use in a receiver of a convolutionally coded communication system.

BACKGROUND OF THE INVENTION

Convolutional codes are often used in digital communication systems to protect transmitted information from error. Such communication systems include the Direct Sequence Code Division Multiple Access (DS-CDMA) standard IS-95 and the Global System for Mobile Communications (GSM). Typically in these systems, a signal is convolutionally coded into an outgoing code vector that is transmitted. At a receiver, a practical soft-decision decoder, such as a Viterbi decoder as is known in the art, uses a trellis structure to perform an optimum search for the maximum likelihood transmitted code vector.

More recently, turbo codes have been developed that outperform conventional coding techniques. Turbo codes are generally composed of two or more convolutional codes and turbo interleavers. Turbo decoding is iterative and iteratively uses a soft output decoder to decode the individual convolutional component codes. The soft output decoder is usually a MAP (maximum a posteriori) or soft output Viterbi algorithm (SOVA) decoder. The soft output decoder provides information on each bit position that helps the soft output decoder decode the other convolutional codes. At each iteration, the soft output decoder provides information on each bit position that helps in the soft output decoding of the next component convolutional code in the next iteration. If only two convolutional codes constitute a turbo code then after the second iteration the soft outputs are fed back to the soft output decoder operating on the first component code and the process repeats itself. Typically after a fixed number of iterations a halt is called to the decoding process and a hard decision made on the output of the last iteration. If there is little or no impact on the subsequent hard decisions, it is desirable to call an early halt to the iterative process (via a stopping criteria) to save calculation time and more importantly circuit power drain.

Turbo coding is efficiently utilized to correct errors in the case of communicating over an added white Gaussian noise (AWGN) channel. Intuitively, there are a few ways to examine and evaluate the error correcting performance of the turbo decoder. One observation is that the magnitude of log-likelihood ratio (LLR) for each information bit in the iterative portion of the decoder increases as iterations go on. This improves the probability of the correct decisions. The LLR magnitude increase is directly related to the number of iterations in the turbo decoding process. However, it is desirable to reduce the number of iterations to save calculation time and circuit power. The appropriate number of iterations (stopping criteria) for a reliably turbo decoded block varies as the quality of the incoming signal and the resulting number of errors incurred therein. In other words, the number of iterations needed is related to channel conditions, where a noisier environment will need more iterations to correctly resolve the information bits and reduce error.

One prior art stopping criteria utilizes a parity check as an indicator to stop the decoding process. Although doing a parity check is straightforward, it is not reliable if there are many bit errors. Another type of stopping criteria for the turbo decoding is the LLR (log-likelihood-ratio) value as calculated for each decoded bit. Since turbo decoding converges after a number of iterations, the LLR of a data bit is the most direct indicator index for this convergence. One way this stopping criteria is applied is to compare LLR magnitude to a certain threshold. However, it can be difficult to determine the proper threshold as channel conditions are variable. Still other prior art stopping criteria measure the entropy or difference of two probability distributions, but this requires much calculation.

There is a need for a decoder that can determine the appropriate stopping point for the number of iterations of the decoder in a reliable manner. It would also be of benefit to provide the stopping criteria without a significant increase in calculation complexity.

DETAILED DESCRIPTION OF THE PREFERRED EMBODIMENTS

The present invention provides a turbo decoder that dynamically utilizes a cross-correlation of extrinsic inputs and outputs as a stopping criteria of the in-loop data stream at each constituent decoder stage, as the loop decoding iterations proceed. This cross-correlation value is used as a stopping criteria to determine the number of iterations needed in the decoder. Advantageously, by limiting the number of calculations to be performed in order to decode bits reliably, the present invention conserves power in the communication device and saves calculation complexity.

The operation of turbo coders and decoders and the utilization of MAP (maximum a posteriori) decoders and log-likelihood ratios (LLRs) is well known in the art and will not be presented here. Most of the soft input-soft output (SISO) decoders considered for turbo codes are based on the prior art optimal MAP algorithm in a paper by L. R. Bahl, J. Cocke, F. Jelinek, and J. Raviv entitled "Optimal Decoding of Linear Codes for Minimizing Symbol Error Rate", IEEE Transactions on Information Theory, Vol. IT-20, March 1974, pp. 284–7 (BCJR algorithm).

Figure 1:
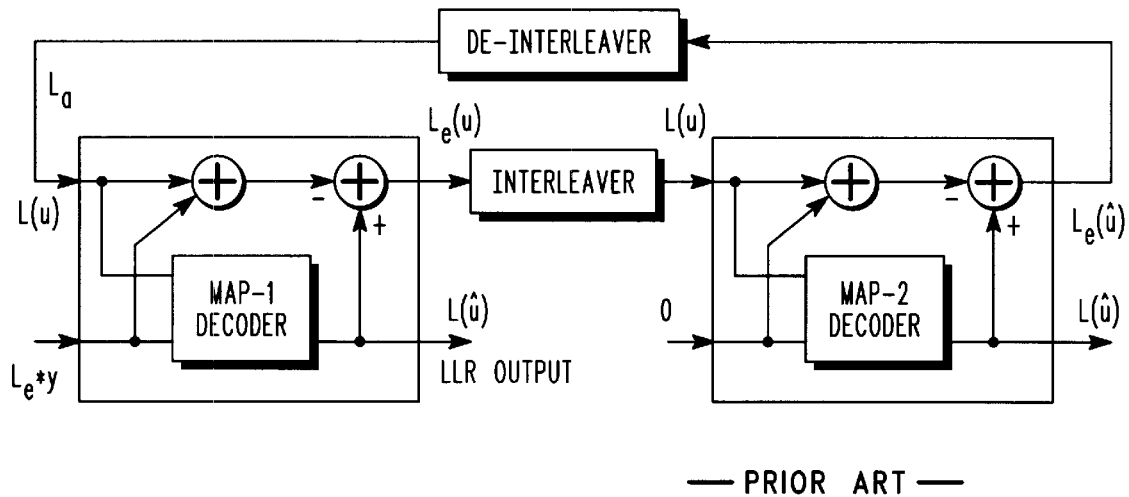
FIG. 1 shows a simplified block diagram for a turbo decoder as is known in the prior art.

FIG. 1 shows a typical turbo decoder that is constructed with interleavers, deinterleavers, and decoders. The mechanism of the turbo decoder regarding extrinsic information $L_e(u)$, $L_e(\hat{u})$, interleaver, de-interleaver, and the iteration process between the soft-input, soft-output decoder sections MAP-1 and MAP-2 follow the Bahl algorithm. Assuming zero decoder delay in the turbo decoder, the first decoder (MAP-1) computes a soft output from the input signal bits, $L_c \cdot y$, and the a priori information $(L_a)$, which will be described below. The soft output is denoted as $L_e(u)$, for extrinsic data from the first decoder. The second decoder (MAP-2) is input with interleaved versions of $L_e(u)$, (the a priori information for MAP-2). The second decoder generates extrinsic data, $L_e(\hat{u})$, which is deinterleaved to produce $L_a$ which is fed back to the first decoder. Typically, the above iterations are repeated for a fixed number of times (usually sixteen) for each bit until all the input bits are decoded.

MAP algorithms provide the probability that the information bit is either a 1 or 0 given the received sequence. The prior art BCJR algorithm provides a soft output decision for each bit position wherein the influence of the soft inputs within the block is broken into contributions from the past (earlier soft inputs), the present soft input, and the future (later soft inputs). The BCJR decoder algorithm uses a forward and a backward generalized Viterbi recursion on the trellis to arrive at a soft output for each trellis section (stage). These a posteriori probabilities, or more commonly the log-likelihood ratio (LLR) of the probabilities, are passed between SISO decoding steps in iterative turbo decoding, as is known in the art.

The performance of turbo decoding is affected by many factors. One of the key factors is the number of iterations. As a turbo decoder converges after a few iterations, more iterations after convergence will not increase performance significantly. Turbo codes will converge faster under good channel conditions requiring a fewer number of iterations to obtain good performance. The number of calculations performed is directly proportional to the number of iterations made and affects power consumption. Since power consumption is of great concern in the mobile and portable radio communication devices, there is an even higher emphasis on finding reliable and good iteration stopping criteria. Motivated by these reasons, the present invention provides an adaptive scheme for stopping the iteration process.

The number of iterations is defined as the total number of SISO or MAP decoding stages used (i.e. two iterations in one cycle). Accordingly, the iteration number counts from 0 to 2N-1, where 2N is the number of bits. Each decoding stage can be either SSO, MAP or SOVA. The key factor in the decoding process is to combine the extrinsic information into a MAP or SISO block. The final hard decision on the information bits is made according to the value of the LLR after iterations are stopped. The final hard bit decision is based on the LLR polarity. If the LLR is positive, decide +1, otherwise decide −1 for the hard output. Typically, the LLR value converges onto +1 or −1 in much less than the full (sixteen) number of iterations. It would save time and calculation resources to stop iteration once one was relatively sure that the LLR outcome will be either +1 or −1. Some prior art methods have introduced stopping criteria to do just that.

Hagenauer et al. (*Iterative Decoding of Binary Block and Convolutional Codes*, IEEE Transactions On Information Theory, Vol. 42. No. 2, March 1996, pp.429–444) defines iteration stopping criteria based on a cross-entropy (CE) method. The basic idea of cross entropy, defined by $$\text{Cross\_Entropy} = E_p\left\{\log\frac{P(X)}{Q(X)}\right\}$$

is to measure the difference or "closeness" of two probability distributions $P(X)$ and $Q(X)$, where $E_p$ denotes the expectation operator with respect to $P(X)$, and $X=\{X_k\}_{k=0}^{L-1}$ is the data bits. The expectation operator is a predictor of what the next associated value might be given past values. With i.i.d (independently, identically distributed) input assumption, $$\text{Cross\_Entropy} = E_p\left\{\log\frac{P(X)}{Q(X)}\right\} = E_p\left\{\sum_k \log\left(\frac{P(x_k)}{Q(x_k)}\right)\right\}.$$

In Hagenauer et al., cross-entropy was further approximated as $$\text{Cross\_Entropy} \approx \sum_k \frac{|\Delta z_k^{(i)}|}{\exp(|L_k^{(i)}|)} = T(i)$$

where $\Delta z_k^{(1)} = z_k^{(1)} - z_k^{(1-2)}$ is difference of the input extrinsic information to the same constituent decoder between one iteration cycle and $L_k^{(1)}$ is the LLR of the $k^{th}$ bit at the $i^{th}$ iteration. Iterations are stopped when $T(i)$ drops to the range of $(10 \sim 10^4) *T(1)$.

Shao et al (Two Simple Stopping Criteria for Turbo Decoding, IEEE Trans. Comm., Vol. 47, No. 8, Aug., 1999, pp. 1117–1120) simplified the criterion of Hagenauer with further approximations to arrive at the following two indexes for iteration stopping: (a) SCR (sign change ratio) criterion: Let $C(i)$ denote the number of sign changes in the extrinsic information input to a same constituent decoder between iteration cycles. If $C(i) \leq (0.005-0.03)*L$, iteration can be stopped, and (b) HDA (hard decision aided) criterion where hard decisions are stored at (i-2)-th iteration and compared with signs of $\{L_k^{(i)}\}$, wherein if the sign matches for each bit in the whole block, iteration can be stopped. Shao et al report that HDA saves more iteration than the CE or SCR for similar BER performance at low SNR. However, HDA is not as efficient in computation saving as either CE or SCR criteria for similar BER performance at high SNR.

Upon reviewing these references, it can be seen immediately that both HDA and SCR need storage of at least one frame worth of signs (sign of extrinsic information or LLR) for later comparison, which requires added hardware.

In contrast, the present invention utilizes a cross-correlation between the input and output of the MAP blocks to be used as the iteration stopping criterion in the turbo decoder. The cross-correlation value improves when more bits are detected correctly per iteration. The present invention uses a threshold level to compare to the cross-correlation value to determine when to stop the iterations, and it can be stopped at half-cycles.

Figure 2:
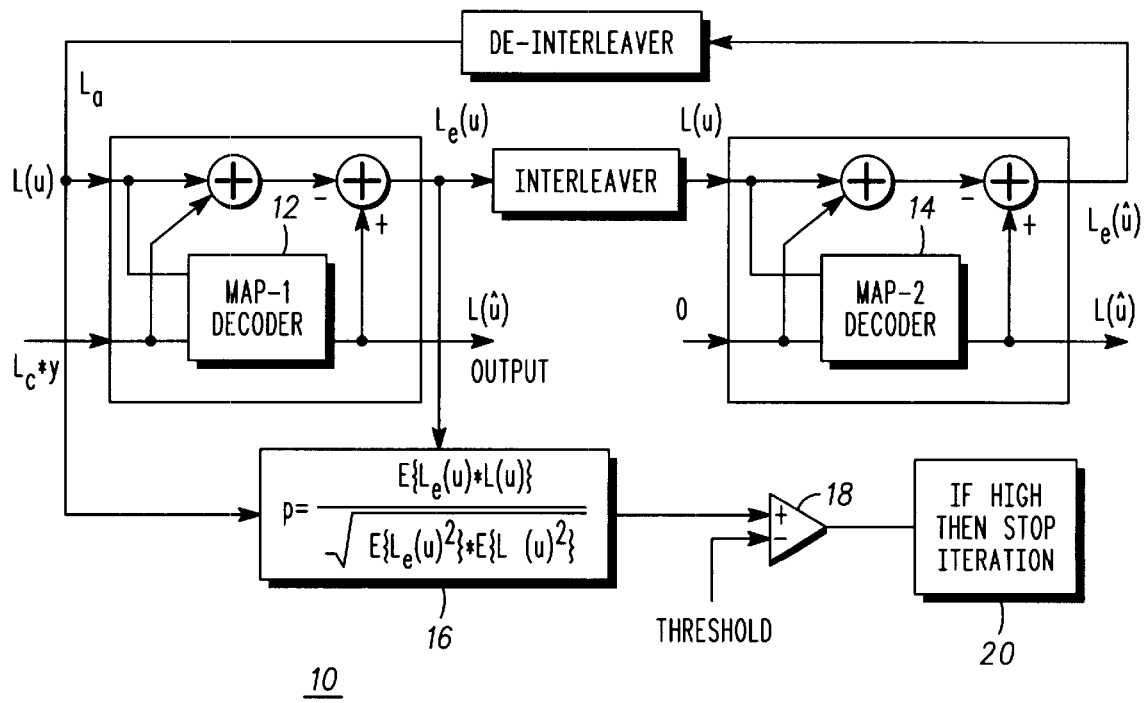
FIG. 2 shows a simplified block diagram for a turbo decoder with a cross-correlation stopping criteria, in accordance with the present invention.

FIG. 2 shows a turbo decoder 10 with cross-correlation and threshold comparison, in accordance with the present invention. The decoder 10 dynamically terminates iteration calculations in the decoding of a received convolutionally coded signal. The turbo decoder includes a first and second recursion processors (MAP-1 and MAP-2) 12,14 connected in an iterative loop. Each processor has an associated input, $L(u)$, and an extrinsic output, $Le(u)$. The recursion processors can perform iteration calculations concurrently. A cross-correlator 16 is coupled to the input and output of at least one of the processors. Preferably, the cross-correlator 16 does a cross-correlation between an input of the first processor, MAP-1, being an a priori extrinsic value, $L_a$, from the output of the second processor, MAP-2, and an output of the first processor, $L_e(u)$. The cross-correlator 16 does a cross-correlation between the extrinsic input and extrinsic output values and provides a cross-correlation value. Specifically, the cross-correlation value is a product of the expected values of the input and output divided by the square root of a product of the squares of the expected values of the input and output extracted at each iteration, as will be explained below. More preferably, the cross-correlation value is a square of the product of the expected values of the input and output divided by a product of the squares of the expected values of the input and output extracted to reduce computational complexity. A comparator 18 compares the cross-correlation value to a predetermined threshold. The threshold can be dynamically variable, to account for changing channel conditions for example. This can be accomplished by making the threshold a function of the LLR ($L(û)$) from at least one of the processors 12,14. Furthermore the expectation calculation can be simplified to one of summation if the normalization factor is also taken into account in the threshold.

A controller 20 terminates the iterations and provides a soft output when the comparator 18 indicates that the cross-correlation value exceeds the threshold.

The use of cross-correlation can be used equally well with any SISO decoder, (e.g. both MAP and SOVA recursion processors). Note that the turbo decoding process remains as is. In practice, two identical MAP recursion processors are used, although different processors can be used. Both processors can be used to provide a cross-correlation value, which allows stoppage of the iterations in mid-cycle, i.e. each processor can act independently such that either processor can signal a stop to iterations, or one processor can stop iterations mid-cycle. In other words, the present invention can be applied at the output of either SISO decoder and not necessarily at the output of just one, such that stoppage can be applied at every iteration (half cycle) and not just every 2 iterations (cycle). In addition, since iterations can be stopped mid-cycle, a soft output is generated for the transmitted bits from the LLR of the processors where the iteration is stopped. Preferably, only one processor, for example MAP-1, is used for iteration stopping for simplicity.

The objective of turbo decoding is to compute refined a posteriori probabilities for the information bits, u, of a signal in an iterative fashion. In practice, the signal consist of a simple convolutional code, wherein a standard MAP processor is used in order to generate the desired estimates of the a posteriori probabilities. The necessary extrinsic information is then passed to the second constituent processor.

The log-likelihood ratio of the information bit, conditioned on the matched filter output y, is defined as:

$$L(u \mid y) = \log \frac{P(u = +1 \mid y)}{P(u = -1 \mid y)} \quad (1)$$

$$= \log \frac{P(y \mid u = +1)}{P(y \mid u = -1)} + \log \frac{P(u = +1)}{P(u = -1)}$$

For a transmission over a Gaussian channel with fading, the log-likelihood can be further expanded:

$$L(u \mid y) = \log \frac{\exp\left(-\frac{E_s}{N_0}(y-\alpha)^2\right)}{\exp\left(-\frac{E_s}{N_0}(y+\alpha)^2\right)} + \log \frac{P(u = +1)}{P(u = -1)} \quad (2)$$

$$= L_c \cdot y + L(u)$$

where $L(u)$ corresponds to the a priori knowledge of the value of u, independently of the channel observations. The term $L_c \cdot y$ corresponds to the scaled channel outputs. The channel estimate $L_c$ has the following expression:

$$L_c = 4\alpha \cdot E_s/u \; N_O \quad (3)$$

For a fading channel, ox corresponds to the fading amplitude. For a Gaussian channel, a is equal to 1. In a turbo decoding structure, after the first iteration, $L(u)$ is replaced with the extrinsic information Le (u) provided by the other constituent decoder.

The structure of the constituent turbo decoder is shown in FIG. 2. The extrinsic information Le (a) for each processor is generated using the following equation:

$$L_e(û) = L(û) - (L_c \cdot y + L(u)) \quad (4)$$

The computation of accurate extrinsic information requires detailed knowledge of the channel characteristic $L_c$. As the MAP decoder uses a trellis structure whose branch metrics are very dependent on the channel soft values, any incorrect knowledge of the channel estimate $L_c$ might result in severe performance degradation. Therefore, proper scaling of the soft channel values is a required operation in turbo decoding.

In the present invention, a cross-correlation value, p, between the output $L_e(u)$ and input $L(u)$ of the first MAP decoder 12 is used as the criterion for terminating iterations of the turbo decoding. However, it should be recognized that the inputs and outputs from either or both of the MAP decoders could be used for the purpose of the invention. The cross-correlation value is defined as:

$$\rho = \frac{E\{L_e(u) \cdot L(u)\}}{\sqrt{E\{L_e(u)^2\} \cdot E\{L(u)^2\}}} \quad (5)$$

where the E{x.y} terms are the expected (average) values of the respective terms. In other words E{x.y} is the average of multiplying x by y. The cross-correlation criterion of Eq. 5 is used instead of the prior art methods previously described. As can be seen, the Eq. 5 contains a square-root operation and a division which involve many floating-point operations. Fortunately, such calculations can be avoided by using the square of the above equation $$\rho^2 = \frac{E^2\{L_e(u) \cdot L(u)\}}{E\{L_e(u)^2\} \cdot E\{L(u)^2\}} \quad (6)$$

Moreover, the above division operation can be circumvented by comparing the square of the unnormalized cross-correlation term (numerator) to the threshold value multiplied by the variances (denominator) as shown by $$E^2\{L_e(U) \cdot L(u)\} > p2 \times (E\{Le(U)^2\} e \; E\{L(u)^2\}) \quad (7)$$

The behavior of this cross-correlation value is that it converges very quickly for the first a few iterations. As can be seen from simulation results below, this behavior describes the turbo decoding process well and serves as a good stopping criteria for the turbo decoding process. In operation, the turbo decoding iterations are stopped if this value crosses a predetermined threshold value. The threshold value can be dynamically varied depending on channel conditions. For example, statistics, distribution patterns, or a moving average can be generated from the LLR to determine a threshold value.

Optionally, the cross-correlation value can be used as a retransmit criteria in a radio communication system. For example, using a lower threshold for frame quality, if the cross-correlation value is still below the lower threshold after a predetermined number of iterations, decoding can be stopped and a request sent for frame retransmission.

Example

A numerical simulation was performed using the cross-correlation threshold criterion, in accordance with the present invention. The results are provided below. From a statistical point of view two types of errors can occur from the decoding method of the present invention; false alarm and missed detection. A false alarm occurs when the cross-correlation threshold criterion shows convergence when in fact there is no convergence. On the other hand, a missed detection occurs when the cross-correlation threshold criterion shows no convergence when in fact there is convergence. The results from each cross-correlation threshold criterion prediction error are different however. A false alarm results in an increase bit-error-rate (BER) while a missed detection results in an increased number of iterations. As a result, for the sake of communication reliability it is more important to avoid false alarms than it is to avoid missed detections. On the other hand, managed miss detection will result in power saving with a reliability penalty. By varying the threshold value, a successful tradeoff can be made wherein the present invention provides improved false alarm and missed detection over the prior art cross-entropy method.

Figure 3:
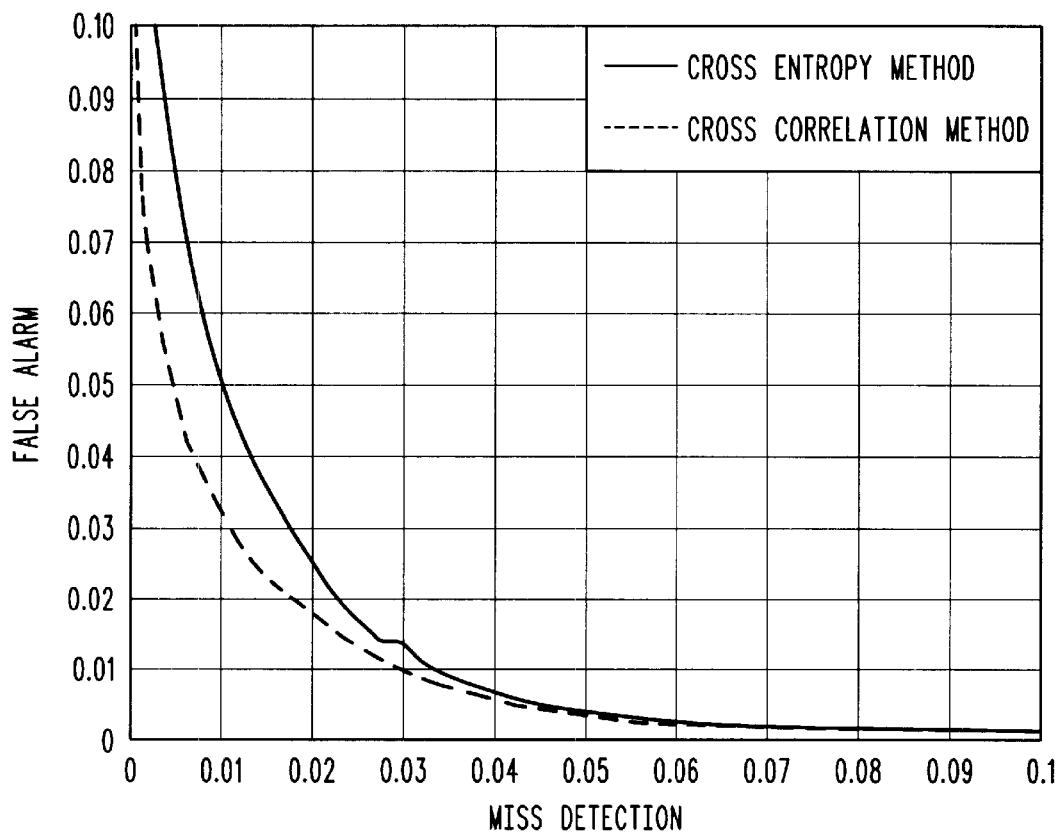
FIG. 3 shows a graphical representation of a first improvement provided by the present invention.

FIG. 3 shows a chart of the results of a simulation of false alarms versus missed detection for the present invention over the prior art cross-entropy method. It serves as an example of a false alarm versus missed detection curve given a specific SNR level that is obtained by varying the decision threshold. By examining SNR levels of interest, this type of curve provides a guide in designing a receiver for choosing an optimal cross-correlation threshold level matched to a false alarm·miss detection work point, as part of the receiver quality versus power consumption budgeting.

In the simulation result presented here, an identical simulated signal was used in each case for convergence detection of a CDMA2000 standard code with code rate ⅓, G1=13 and G2=15, as is known in the art. The simulation was run with 2000 frames of size 640 bits and the SNR point is 0.75 dB. As can be seen, the present invention provides reduced false alarms and missed detections over the prior art method.

Figure 4:
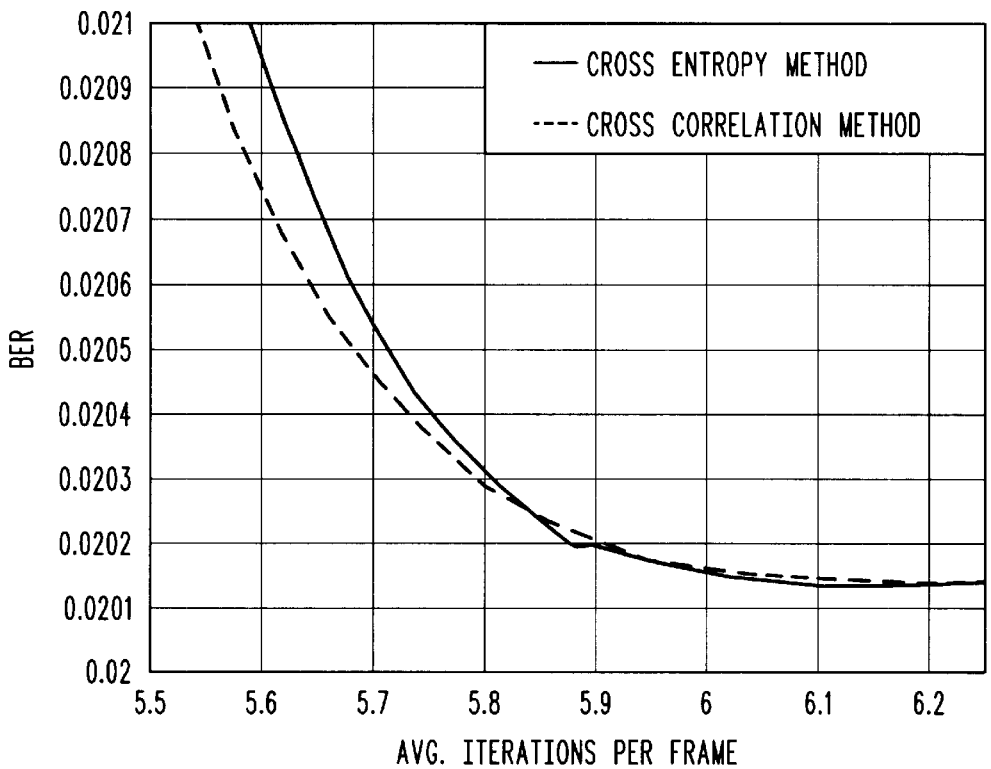
FIG. 4 shows a graphical representation of a second improvement provided by the present invention.

FIG. 4 shows a chart of the same simulation showing the BER versus average number of iterations for the present invention over the prior art cross-entropy method. As can be seen, the present invention provides improved BER over the prior art method using a method with less calculations.

Figure 5:
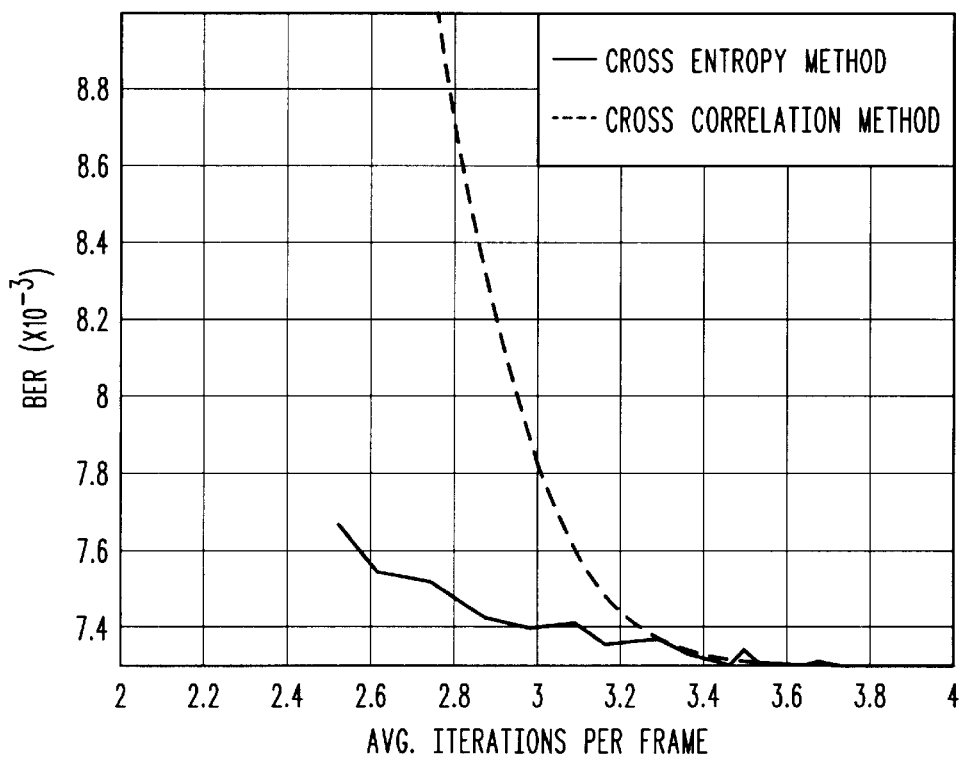
FIG. 5 shows a graphical representation of a third improvement provided by the present invention.

FIG. 5 shows a chart of the same simulation showing the BER versus average iterations per frame for the present invention over the prior art cross-entropy method. In this case Rayleigh fading is tested using parameters known in the art (19.2 kbps (384 symbols), Ior/Ioc=4 dB, Ec/Ior=−16 dB, 2-path Rayleigh 120 km/hr). As can be seen, the present invention provides improved BER during Rayleigh fading over the prior art.

In review, the present invention provides a decoder that dynamically terminates iteration calculations in the decoding of a received convolutionally coded signal using cross-correlation. The decoder includes a standard turbo decoder with two recursion processors connected in an iterative loop. A novel aspect of the invention is performing a cross-correlation between extrinsic inputs and outputs during iteration. The cross-correlation value is compared to a predetermined threshold to determine when to stop iterations.

A cross-correlation between the input and output of at least one of the recursion processors is used to provide a stopping criteria of the decoding process at each iteration and directs a controller to terminate the iterations when the measure of the cross-correlation value exceeds a predetermined threshold level. The present invention provides a better measure in an AWGN channel than the prior art cross-entropy method.

Figure 6:
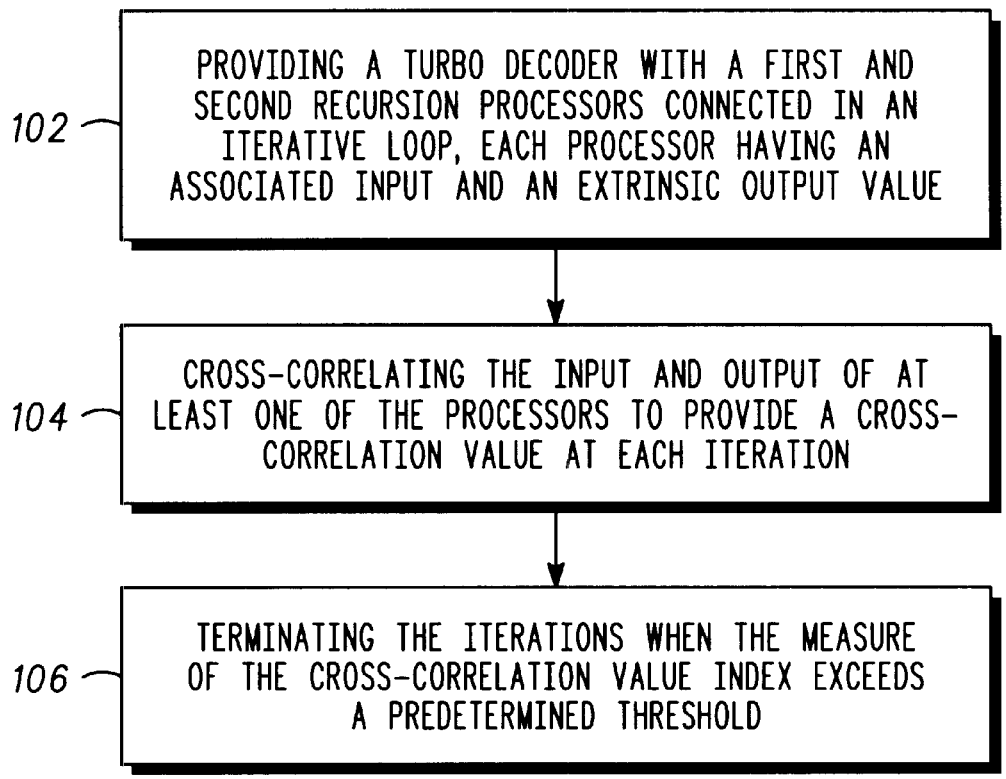
FIG. 6 shows a method for turbo decoding, in accordance with the present invention.

FIG. 6 shows a flow chart representing a method 100 of terminating iteration calculations in the decoding of a received convolutionally coded signal. The method includes a first step 102 of providing a turbo decoder with a first and second recursion processors connected in an iterative loop. Each processor having an associated input and an extrinsic output value. The recursion processors can concurrently performing iteration calculations on the signal. Preferably, the recursion processors are MAP, SISO or SOVA processors. The input of the first processor, after one iteration, is an a priori extrinsic value from the output of the second processor.

A next step 104 includes cross-correlating the input and output of at least one of the processors to provide a cross-correlation value at each iteration. Preferably, this step includes cross-correlating the input and output of the first processor. Specifically, this step includes the cross-correlation value being the expectation of the product of the input and output divided by the square root of a product of the squares of the expectation of the input and output extracted at each iteration. More preferably, this step includes the cross-correlation value being a square of a product of the input and output divided by a product of the squares of the input and output extracted at each iteration to reduce calculations and floating point operations.

A next step 106 includes terminating the iterations when the measure of the cross-correlation value index exceeds a predetermined threshold. The threshold can be dynamically variable, such as being a function of channel conditions and the like. A last step includes outputting an output derived from the soft output of the at least one of the processors existing after the terminating step. Preferably, the output is a hard-decision of the LLR value from the first processor.

While specific components and functions of the turbo decoder for convolutional codes are described above, fewer or additional functions could be employed by one skilled in the art and be within the broad scope of the present invention. The invention should be limited only by the appended claims.

What is claimed is:

1. A method of terminating iteration calculations in the decoding of a received convolutionally coded signal, the method comprising the steps of:

providing a turbo decoder with a first and second recursion processors connected in an iterative loop, each processor having an associated input and an extrinsic output value, the input of the first processor being an a priori extrinsic value front the output of the second processor;

cross-correlating the input and output of at least one of the processors to provide a cross-correlation value at each iteration, the cross-correlation value being the expectation of the product of the input and output divided by the square root of a product of the squares of the input and output extracted at each iteration; and terminating the iterations when the measure of the cross-correlation value index exceeds a predetermined threshold.

2. The method of claim 1, wherein the providing step includes the recursion processors being soft-input, soft-output decoders.

3. The method of claim 1, wherein the cross-correlation step includes cross correlating the input and output of the first processor.

4. A method of terminating iteration calculations in the decoding of a received convolutionally coded signal, the method comprising the steps of:

providing a turbo decoder with a first and second recursion processors connected in an iterative loop, each processor having an associated input and an extrinsic output value, the input of the first processor being an a priori extrinsic value from the output of the second processor;

cross-correlating the input and output of at least one of the processors to provide a cross-correlation value at each iteration, the cross-correlation value being a square of the expectation of the product of the input and output divided by a product of the squares of the input and output extracted at each iteration; and terminating the iterations when the measure of the cross-correlation value index exceeds a predetermined threshold.

5. The method of claim 1, wherein the terminating step includes a variable threshold.

6. The method of claim 1, further comprising a step of outputting an output derived from the soft output of the at least one of the processors existing after the terminating step.

7. The method of claim 6, wherein the outputting step includes outputting a hard-decision from the a LLR value at the output of the at least one of the processors existing after the terminating step.

8. A method of terminating iteration calculations in the decoding of a received convolutionally coded signal, the method comprising the steps of:

providing a turbo decoder with a first and second MAP processors connected in an iterative loop, the first MAP processor having art extrinsic output and an associated input derived from an a priori extrinsic output of the second MAP processor;

cross-correlating the extrinsic input and output of the first processor to provide a cross-correlation value at each iteration, the cross-correlation value being a product of the input and output divided by the square root of a product of the squares of the input and output extracted at each iteration;

terminating the iterations when the measure of the cross-correlation value index exceeds a predetermined threshold; and outputting an output derived from the soft output of the first processor existing after the terminating step.

9. A method of terminating iteration calculations in the decoding of a received convolutionally coded signal, the method comprising the steps of:

providing a turbo decoder with a first and second MAP processors connected in an iterative loop, die first MAP processor having an extrinsic output and an associated input derived from an a priori extrinsic output of the second MAP processor;

cross-correlating the extrinsic input and output of the first processor to provide a cross-correlation value at each iteration, die cross-correlation value being a square of the expectation of the product of the input and output divided by a product of the squares of the expectation of the input and output extracted at each iteration;

terminating the iterations when the measure of the cross-correlation value index exceeds a predetermined threshold; and outputting an output derived from the soft output of the first processor existing after the terminating step.

10. A decoder that dynamically terminates iteration calculations in the decoding of a received convolutionally coded signal, the decoder comprising:

a turbo decoder with a first and second recursion processors connected in an iterative loop, each processor having an associated input and an extrinsic output;

a cross-correlator coupled to the input and output of at least one of the processors, die cross-correlator provides a cross-correlation value for the input and output the cross-correlation value is a square of the expectation of the product of the input and output divided by the expectation of the product of the squares of the input and output extracted at each iteration;

a comparator for comparing the cross-correlation value to a predetermined threshold; and a controller that terminates the iterations when the comparator indicates that the cross-correlation value exceeds the threshold.

11. The decoder of claim 10, wherein the recursion processors are soft-input, soft-output decoders.

12. The decoder of claim 10, wherein the input of the first recursion processor is an a priori extrinsic value from the output of the second processor, and wherein the cross-correlator cross-correlates the input and output of the first processor.

13. A decoder that dynamically terminates iteration calculations in the decoding of a received convolutionally coded signal, the decoder comprising:

a turbo decoder with a first and second recursion processors connected in an iterative loop, each processor having an associated input and an extrinsic output;

a cross-correlator coupled to the input and output of at least one of the processors, the cross-correlator provides a cross-correlation value for the input and output, the cross-correlation value is a product of the input and output divided by the square root of a product of the squares of the input and output extracted at each iteration;

a comparator for comparing the cross-correlation value to a predetermined threshold; and a controller that terminates the iterations when the comparator indicates that the cross-correlation value exceeds the threshold.

14. The decoder of claim 10, wherein the threshold is variable.

* * * * *

UNITED STATES PATENT AND TRADEMARK OFFICE
CERTIFICATE OF CORRECTION

PATENT NO. : 6,738,948 B2  Page 1 of 1
DATED : May 18, 2004
INVENTOR(S) : Dinc, Abdulkadir et al.

It is certified that error appears in the above-identified patent and that said Letters Patent is hereby corrected as shown below:

Column 9,
Line 45, change "a hard-decision from the" to -- a hard-decision from --

Column 10,
Lines 11 and 27, change "die" to -- the --

Signed and Sealed this

Twenty-first Day of September, 2004

JON W. DUDAS
*Director of the United States Patent and Trademark Office*